US012566227B2

(12) United States Patent
Hänichen et al.

(10) Patent No.: US 12,566,227 B2
(45) Date of Patent: Mar. 3, 2026

(54) SHIM COILS FOR A COMPACT MRI GRADIENT SYSTEM BASED ON MULTILAYER FLEXIBLE PRINTED CIRCUIT BOARDS AND ARRANGEMENT SCHEME OF CONDUCTOR LAYERS

(71) Applicant: Bruker France S.A.S., Wissembourg (FR)

(72) Inventors: Lukas Hänichen, Karlsruhe (DE); Sebastian Breham, Wissembourg (FR); Pierre Germain, Oberhoffen lès Wissembourg (FR)

( * ) Notice: Subject to any disclaimer, the term of this patent is extended or adjusted under 35 U.S.C. 154(b) by 140 days.

(21) Appl. No.: 18/605,413

(22) Filed: Mar. 14, 2024

(65) Prior Publication Data

US 2024/0319303 A1     Sep. 26, 2024

(30) Foreign Application Priority Data

Mar. 21, 2023    (EP) .................................... 23315058

(51) Int. Cl.
| | |
|---|---|
| *G01R 33/3875* | (2006.01) |
| *G01R 33/00* | (2006.01) |
| *G01R 33/385* | (2006.01) |

(52) U.S. Cl.
CPC ..... *G01R 33/3856* (2013.01); *G01R 33/0052* (2013.01); *G01R 33/0076* (2013.01); *G01R 33/3858* (2013.01); *G01R 33/3875* (2013.01)

(58) Field of Classification Search
CPC ............ G01R 33/3856; G01R 33/0052; G01R 33/0076; G01R 33/3858; G01R 33/3875; G01R 33/385; H01F 5/003; H01F 5/04; H01F 27/10; H01F 27/22; H01F 41/04; H01F 41/041
See application file for complete search history.

(56) References Cited

U.S. PATENT DOCUMENTS

| | | | |
|---|---|---|---|
| 5,773,976 | A | 6/1998 | Sakakura et al. |
| 7,154,270 | B2 | 12/2006 | Arz et al. |
| 9,817,096 | B2 | 11/2017 | Freytag |
| 2002/0008516 | A1 | 1/2002 | Dietz et al. |

(Continued)

FOREIGN PATENT DOCUMENTS

| | | | |
|---|---|---|---|
| DE | 10315539 A1 * | 10/2004 | .......... G01R 33/385 |
| DE | 102013204952 | 5/2014 | |

(Continued)

*Primary Examiner* — Daniel R Miller
(74) *Attorney, Agent, or Firm* — DECODE Legal Inc.

(57) ABSTRACT

A combined gradient coil and shim coil assembly for use in MR-devices, comprising a cylindric carrier tube, a gradient coil system arranged concentrically onto the carrier tube, a cooling tube assembly positioned around the gradient coils, and an active shim coil system, is characterized in that the active shim coil system is constructed on a flexible printed circuit board, and the assembly further comprises a sealing compound with a fluid reaction resin augmented with a heat conductive filler enclosing the components of the assembly to form a cylindrical tube and filling the cavities of the gradient and the shim coil systems and between the coils and the carrier tube. Such a combined gradient and shim coil assembly is particularly compact having an efficient cooling system allowing a precise positioning of the coils and a time-saving manufacturing.

14 Claims, 4 Drawing Sheets

(56)             References Cited

U.S. PATENT DOCUMENTS

| | | | |
|---|---|---|---|
| 2003/0171048 A1* | 9/2003 | Stocker | B32B 5/12 |
| | | | 442/175 |
| 2005/0146330 A1* | 7/2005 | Teklemariam | G01R 33/385 |
| | | | 324/318 |
| 2005/0168222 A1* | 8/2005 | Arz | G01R 33/3856 |
| | | | 324/318 |
| 2011/0167857 A1* | 7/2011 | Corbeil | A61B 6/4417 |
| | | | 324/318 |
| 2012/0119741 A1* | 5/2012 | Kimmlingen | G01R 33/3858 |
| | | | 324/318 |
| 2012/0317795 A1 | 12/2012 | Fath et al. | |
| 2014/0184226 A1 | 7/2014 | Seeber | |
| 2016/0054407 A1 | 2/2016 | Parizh et al. | |
| 2020/0185136 A1 | 6/2020 | Guenter et al. | |

FOREIGN PATENT DOCUMENTS

| | | | |
|---|---|---|---|
| EP | 3667351 B1 | | 6/2020 |
| EP | 4310529 A1 | | 1/2024 |
| JP | H11133129 A | * | 5/1999 |
| JP | 2006051110 A | * | 2/2006 |
| JP | 2010088618 A | * | 4/2010 |
| JP | 2012170719 A | * | 9/2012 |
| WO | 2003093853 | | 11/2003 |
| WO | 2012001598 A1 | | 1/2012 |

* cited by examiner

10

11
12
13
14
18
15

14'

14''

14'

22

14''

14''

14'

16

22

SHIM COILS FOR A COMPACT MRI GRADIENT SYSTEM BASED ON MULTILAYER FLEXIBLE PRINTED CIRCUIT BOARDS AND ARRANGEMENT SCHEME OF CONDUCTOR LAYERS

BACKGROUND OF THE INVENTION

Field of the Invention

The present invention relates to a combined gradient coil and shim coil assembly for use in MR-devices, comprising a cylindric carrier tube, a gradient coil system arranged concentrically onto the carrier tube, a cooling tube assembly positioned around the gradient coils, and an active shim coil system. A device of this type is described in WO 03/093853 A1.

Description of the Related Art

The present invention relates to the field of magnetic resonance analysis of sample materials and, more specifically, to the nuclear spin polarization of samples for analysis using magnetic resonance measurement techniques. Nuclear magnetic resonance (NMR) is a phenomenon in which certain atomic nuclei become magnetically polarized in proportion to an applied magnetic field and, as a result, will absorb and re-emit electromagnetic radiation. It serves as the basis for certain measurement techniques, including magnetic resonance imaging (MRI) and NMR spectroscopy. Nuclear magnetic resonance spectroscopy is a powerful tool in instrumental chemical analysis. In NMR experiments, a sample is exposed to a strong static magnetic field which interacts with spins of nuclei contained in the sample. Radio frequency (RF) pulses are sent into the sample for manipulating the spins, and the sample's reaction, i.e., RF signals (also called NMR signals) are measured. The sample's reaction depends on the environment of the nuclei in the sample, in particular bonding electrons. Accordingly, information about the chemical structure of the sample can be obtained by analysing the RF signals measured.

Both the principle of nuclear magnetic resonance (NMR) and electron paramagnetic resonance (EPR) can be extended to an imaging method. Both methods have in common that the sample volume to be examined (Volume of Interest (VOI)) is exposed to a temporally and spatially constant (static, homogeneous) magnetic field.

With the aid of superimposed high-frequency electromagnetic fields, the atomic nuclei or electrons are in turn excited to oscillations, which are received by suitable coils and evaluated by means of analog and digital signal processing. By superimposing linear gradients on the original magnetic field, the frequency coding of the spatial information required for imaging is achieved.

These linear gradients are generated by so-called gradient coils, which are usually designed as solenoid and saddle coils and are part of a hollow cylindrical assembly—the so-called gradient tube or gradient system. Depending on the size and design, ohmic losses of up to several kW occur in these coils, which must be dissipated via a suitable cooling concept.

The quality of the imaging depends largely on the homogeneity of the static magnetic field, which is also negatively affected by the presence of objects in the sample volume. Inherent components of the gradient tube are therefore also a large number of so-called shim coils, which compensate for the disturbing field orders and thus improve the homogeneity. The outer diameter Ra of the gradient tube is limited upward by the bore diameter, while the inner diameter Ri is limited downward by the space requirements of the high-frequency transmit/receive coils.

The space available for gradient coils, shim coils and cooling is thus limited to a hollow cylinder with $Ri<R<Ra$. With the achievable shim stroke, the required flow rate increases and thus also the space requirement of the respective coil group. For the interconnection of the individual coils, an additional conductor layer together with insulation is usually necessary. This requires additional space in the radial direction, making efficient use of the limited installation space essential.

To generate higher field orders, i.e., field characteristics with quadratic, cubic or other dependence on the spatial coordinates, wire coils with variable pitch or arrangements of several wire coils are usually required. The coils, made of enameled copper wire, are complex and delicate to manufacture. Frame coils must also be bent to the radius of curvature of the surface in question before application. During application, exact positioning of the coils in the range of a few tenths of a millimeter is important, otherwise deviations from the calculated field geometry are to be expected.

The frame coils are usually wound radially in layers from the inside to the outside. The connection is thus made in the center (start of winding) and at the maximum radius on the outside (end of winding). The supply line to the center thus crosses the entire winding, must be electrically insulated against it and therefore requires approximately the same thickness as the coil itself.

Another aspect of the present invention is the removal of heat generated during operation. Due to the electrical current in the gradient coils and in the shim coils, a lot of heat can be dissipated which can only be removed by an active cooling. According to the state of the art (e.g., WO 03/093853 A1), this is realized by plastic or copper heat exchangers, which are first brought into contact with the respective coils in the best possible way. Subsequently, coils and heat exchangers are provided with a chill casting to achieve the necessary mechanical stability. Said chill casting is generally composed of a liquid reaction resin enriched with filler having particularly high thermal conductivity.

An actively shielded cylindrical gradient coil system having a shim system for NMR devices providing for cryogenic cooling of the gradient system is described for instance in DE 10 2013 204 952 B3.

Cooling of a shim system in an NMR device by means of body contact of the shims with a container filled with liquid helium for cryogenic cooling of NMR magnet coils is disclosed in EP 3 667 351 B1.

US 2016/0054407 A1 discloses an arrangement of active shim coils inside MRI systems. In these systems, resistive shims are located inside the gradient coil assembly. The sets of saddle-shape shims are preferably constructed on a flexible printed circuit board.

U.S. Pat. No. 5,773,976 A describes a cylindrical shim coil assembly for clinical MRI scanners comprising a gradient coil unit generating a gradient magnetic field superposed on the static magnetic field, being formed into a substantially cylindrical shape having an outer circumferential surface, and for shielding the gradient magnetic field from leaking out into a radially outer space of the gradient coil unit; and a shim coil unit generating a correcting magnetic field homogenizing the static magnetic field and being mounted on the outer circumferential surface of the gradient coil unit, in common serving as a bobbin for the shim coil unit.

U.S. Pat. No. 5,773,976 A discloses a gradient coil unit and a shim coil unit comprising a plurality of shim coils which are applied on a flexible PCB is wound on the outer circumferential surface of the gradient coil unit. The coil assembly is designed for clinical systems with a large inner bore of at least 50 cm. The shim coils can be applied on both sides of the flexible printed-circuit boards and interconnected by crossing jumpers. The inserted PCB foils are only slightly bent here, since the diameter of the bore is relatively large. The different coils are separated by resin tape layers or foils which are wound about the outer circumferential surface of the shim coils for the purpose of protection and insulation. However, no thermal conductivity is mentioned. The intermediate insulation foil layers are not efficient for transporting heat, which is generated by the coils.

The continuous addition of resin during the winding process, i.e., while the wire and tape insulation is wound on the bobbin, is commonly referred to as wet winding. Dosage of the resin, adjusting the viscosity is delicate, as low viscosity resin will flow quickly and drip down while high viscosity may lead to crevices that are not filled and may develop dielectric issues (not passing high voltage testing, due to insulation breakdown). More resin than necessary is used which is problematic from the waste point of view. Furthermore, the entire process is open and thus prone to pollution with dust particles.

WO 03/093853 A1 (already discussed above) discloses a gradient coil system for a magnetic resonance apparatus having gradient coils, shim coils and at least one cooling tube for cooling the gradient coils using a coolant flowing through the cooling tube. The cooling tube is formed of a flexible thermoplastic material, augmented with a filler, and has a thermal conductivity greater than 0.5 W/mK.

SUMMARY OF THE INVENTION

The present invention proposes a way to substantially overcome one or more disadvantages and trade-offs of the above discussed existing prior art devices. One major object of the present invention is to provide a particularly compact combined gradient and shim coil assembly with an efficient cooling system allowing a precise positioning of the coils and a time-saving manufacturing.

According to the present invention, these objectives are achieved by modifying the device discussed above in that the active shim coil system is constructed on a flexible printed circuit board, and the assembly further comprises a sealing compound with a fluid reaction resin augmented with a heat conductive filler enclosing the components of the assembly to form a cylindrical tube and filling the cavities of the gradient and the shim coil systems and between the coils and the carrier tube.

The basic idea underlying the present invention was to develop a combined gradient coil and shim coil assembly for use in MR-devices as defined above, which is using flexible shim coils that allow a very compact spatial arrangement. In addition, the combined coil assembly together with the cooling tube assembly are encapsulated by conjoint backfilling with a heat conductive filler.

In this newly developed method for producing generic MR-devices, a vacuum casting technique is applied. The right vacuum casting technique ensures perfect filling of all crevices, usage of the exact amount and takes place in a hermetically sealed system preventing any pollution and making insulation issues highly unlikely to happen.

The gradient coil and shim coil assembly is preferably designed for pre-clinical MRI systems, which are used for small animals or for micro-imaging applications. The inner diameter Ri of the assembly is preferably between 1 cm and 20 cm.

The present invention provides: simplified production with high precision compared to wound wire shim coils; no requirement of alignment of the coils to each other, as arrangement on common carrier; a reduced space requirement; a reduced number of assembly sequences, as up to four conductor levels can be realized per carrier; no requirement for wiring of individual shim coils, as connection lines can be realized via one or more conductor levels; simplified storage and assembly by winding or unwinding; and the capability of integrating electronic components on the conductor foils (discrete components such as resistors or semiconductors for switching or measuring tasks).

Further Features of the Invention

Instead of wire frame coils, flexible printed circuit boards with a particularly thick copper layer are used to allow a sufficient electrical current to be fed to the shim coils. Preferably, the thickness of the copper layer is between 35 μm to 500 μm. Due to the production as a whole, the individual coils have a fixed spatial reference to each other, so that the carrier only has to be aligned once as a whole during assembly, preferably with the aid of reference holes. Positioning errors are thus virtually eliminated. The coil carrier is wound onto the cylindrical body of the gradient tube as a finished component; the costly manufacture of wire coils is eliminated altogether. To create flow gaps for vacuum potting (casting), profiles (filaments or other flexible profiles of the desired thickness) are helically wound in as a spacer element, resulting in circumferential channels of the required height between the layers.

The coil interconnection is preferably realized by selecting a two-sided layout. The carrier allows one copper layer each on the top and bottom side. The supply lines of one coil group can be routed between the coils of the other side by appropriate placement of the coil groups and setting of vias, so that four conductor coil circuits can effectively be realized (two coil layers and two supply or connection layers).

A cooling unit is arranged on the outer circumference of the gradient coils. The cooling unit comprises a plurality of parallel or meandering arranged tubes or for conducting a refrigerating liquid. When using parallel metallic tubes it is of importance to avoid that closed loops are formed, into which currents can be induced. These currents could distort the gradient switching. One solution to avoid the formation of closed metallic loops is to fix the tubes into non-metallic connections which are arranged on either side of the coil assembly.

On the outer circumference the flexible PCB with the shim coils are wound. The coils are formed by a micromechanical process or by photolithography. Those methods allow to avoid the complicated handling of wires which is generally not a precise process. The shim coils formed on the PCB can be bent and wound easily onto the stack. With the help of the positioning pins and reference holes in the PCB, it is possible to position the shim coils exactly without the need for additional markings. The manufacturing process is straightforward, and scrap can be avoided.

Optionally, a layer of screen coils can be applied to the outer circumferential layer of the shim coils.

Finally, all the parts are filled with an insulating and thermally conductive resin. This resin is of importance for efficiently evacuating the heat produced by the current in the coils. The casting process can be a final step for filling all the gaps between the layers at once or every single layer of the stack can be filled with the resin separately.

A particular problem to be solved in this layered structure is to ensure the electrical insulation between the coils whilst allowing the thermal conducting resin to penetrate down to the smallest crevice. When using several layers of shim coils on flexible PCB, it is necessary to apply a spacer between each layer. Said spacer should allow the special separation of the coils and allowing the penetration of the resin. Preferably, this spacer may be a filament wound helically around the shim coil layer before applying an additional layer on the outer surface. Other structures which would allow the flow of the resin from one side to the other of the cylindrical stack are also deployable.

Variants of the Invention

In certain embodiments of the present invention, the flexible printed circuit board on which the active shim coil system is constructed has the shape of a foil or a film, which is wound around the cooling tube assembly. The advantage of this solution is that it makes it very easy to wrap the foil around the tube assembly. It has very small thickness compared to standard winded coils allows for more compact systems or to have more shims into the same gap.

In a further embodiment of the invention, the flexible printed circuit board comprises positioning pins and/or reference holes, which can be used for precise mounting in one of the concentrically lower components of the array so that the shim coils are correctly positioned. The flexible printed circuit board on which the active shim coil system is constructed may comprise a foil or a film made of polyimide, in particular Kapton®.

The advantage of using a Kapton® or another polyimide is that it is a very good insulator with a very good mechanical strength, so it can withstand high voltage test between the different shims while having very good mechanical stability when wrapping the foils.

In practical applications of the invention, the flexible printed circuit board is manufactured using a micromechanical process or a photolithographic process. This process allows having very high precision of the shim coils leading to an excellent reproducibility of the coil assemblies. Also, there can be small distances between turns without the risk of having a short circuit between two turns. Furthermore, with this process one can have copper thickness from 35 μm to 500 μm and thus keep the coil resistance low and use high currents up to 10 A meaning higher shims strengths.

Maximum current depends on the thermal properties of the environment, i.e., how good the heat can be dissipated by the cooling mechanism. 30 A/mm$^2$ can be dissipated with the present design, using casting with a fluid reaction resin augmented with a heat conductive filler.

In one particular class of embodiments of the invention, the shim coil system comprises a plurality of layers of flexible printed circuit board, which layers are wound concentrically around the axis of the cylindric carrier tube. Having multilayers circuits allows reducing required space requirements for the shims and reduces the number of steps for the assembly process.

In an advantageous variant of this class of embodiments, the layers of flexible printed circuit board are separated by a spacer element, in particular a flexible filament or flexible profile of a desired thickness, preferably an electrically non-conducting thread. The spacer allows calibrating a defined gap between the foils to ensure that during the casting process the resin can flow. Thereby, an optimal thermal conductivity between the foil and so an optimal cooling of the foils can be guaranteed.

In a further modification of this first variant, the spacer element is wound in a helical manner around each layer of the flexible printed circuit board so as to separate the plurality of shim coils from each other and create a helical gap between the layers that allows the sealing compound to spread and fill the gap. The helix shape ensures that the resin flow will cover the full surface of the foil while maintaining low pressure drop for the resin.

In addition to this further modification of the first variant or as a second variant, the spacer element, in particular the electrically non-conducting thread, is made of a polyimide, in preferably Kapton®. An advantage of Kapton® is its high dielectric strength and high mechanical strength. So, it is possible to apply high mechanical tension on the thread while winding it.

In another embodiment of the invention, electronic components are integrated on the flexible printed circuit board, in particular discrete components such as resistors or semiconductors for switching or measuring tasks. Integrating discrete components directly onto the PCB allows reducing space requirements and ensure good dielectric strength since the discrete components will be under the polyimide sheet. It also reduces the number of assembly steps since the discrete components are directly integrated.

In a further embodiment of the invention, the coil interconnection is realized by selecting a two-sided layout on a carrier. In particular, in this embodiment up to four conductor coil circuits are realized per carrier and that connection lines are realized by setting of vias. This allows reducing the number of assembly steps since all interconnections are already done on the PCB. Using "vias" allows for better routing of the conductor lines on the PCB.

In still another embodiment of the invention, the cooling tube assembly is made of a plurality of copper tubes assembled in a cage-like manner or using a single meander structure made from either welded or soldered tubes or a single 3D print structure. This allows reducing space requirements and pressure drop for a given flow. Either by using multiple small round tubes in parallel or by using 3D printed design with very wide and flat water channels that would be impossible to connect or bend using standard machining techniques. Using 3D printed parts allows using non-conventional material for water jacket such as Ceramic or Titanium. Advantages of these materials over copper are that they maintain a good thermal conductivity while having a much higher electrical resistivity. The electrical resistivity reduces dramatically the amount of losses due to eddy currents in the water jacket.

The scope of this invention also includes a method of manufacturing a combined gradient coil and shim coil assembly for use in MR-devices modified according to the invention as discussed above, this method comprising the following process steps:

A cylindric carrier tube, made e.g. of glass fiber, is provided.

The gradient coil system is applied concentrically to the cylindric carrier tube. The gradient coils are preferably cut out of a copper sheet by a water jet or other mechanical method. Additive manufacturing methods such as 3D printing are also possible. Then the gradient coils cut out in this way are bent to the correct diameter and applied to the fiberglass tube.

The cooling tube assembly is applied around the gradient coils.

Typically, this device entails refrigerant conducting tubes that are typically prefabricated and simply slid over the gradient coils.

The shim coil system constructed on a flexible printed circuit board as a ready finished component is wound and positioned on the outer surface of the cooling tube assembly.

The resulting concentric array as a whole is potted or vacuum casted with a sealing compound, in particular with a fluid reaction resin augmented with a heat conductive filler that is both electrically insulating but at the same time has good thermal conductivity, thus filling the cavities of the gradient and the shim coil systems and between the coils and the carrier tube.

Once the resin has solidified, a cylindrical device is obtained that can be inserted into an MR machine with a precise fit. The individual coil arrangements are optimally positioned and prevented from slipping by the suspensions.

With this method, one can achieve very high dielectric strength while maintaining very small gaps between coils allowing for high voltage operation in a compact design. The high thermal conductivity allows operating at high current and so delivering high field strength.

A particular variant of this method is characterized in that at least two layers of flexible printed circuit boards with the shim coil systems are wound concentrically around the cooling assembly and that a separating thread is wound helically between the at least two layers of the cylindrical shim coil system. A second shim foil can then be hung in and wound up. Optionally, it is possible to wind a single shim foil in multiple layers around the outer circumference of the cooling device. In this case, it should be noted that a plurality of holes should be made in the shielding foil when it is first wound around, and the separating thread threaded through these holes after the first winding around.

In addition to this preferred variant or as an alternative, positioning pins and/or reference holes on the flexible printed circuit board may be used for precise mounting in one of the concentrically lower components of the array so that the shim coils are correctly positioned, in particular the lower components are hooked into a first winding with a second set of holes. This means that they do not need to be additionally fixed with adhesive tape, for example.

Further to any one of the above discussed variants of the method according to the invention, shielding coils, which may be manufactured in a similar way as the gradient coil system, are applied to the outer circumference of the shim coil system before the vacuum casting step. While gradient and shim coils are usually placed as close as possible to the volume of interest, the shielding coils are put as far away as possible, so less power is needed for the compensation of fields the outside region.

For simplified storing and assembling, the shim coil system constructed on a flexible foil is wound or unwound to a small diameter compared to the diameter of the assembly ($R_i = 1$ cm to 20 cm).

Even more advantages can be taken from the description and the drawing. The drawings do not necessarily show the various characteristics true to scale. Moreover, according to the invention, the features stated above and further below can be used singly or together in any combination. The embodiments shown and described are not intended to be an exhaustive list, rather are examples to explain the invention.

8

BRIEF DESCRIPTION OF THE DRAWINGS

These, as well as other objects and advantages of this invention can be better understood and appreciated through careful study of the following detailed description of presently preferred exemplary embodiments of this invention in conjunction with the accompanying drawings.

In order to make the aforesaid and other features and advantages of the present invention more apparent to those skilled in the art, preferred embodiments of the present invention will be described in detail below by referring to the accompanying drawings, wherein identical numerals represent the same parts.

DETAILED DESCRIPTION

The following detailed description presents examples that disclose specific details and are intended to explain, not to restrict, in order to provide a more in-depth understanding of the present teachings. For a person skilled in the art who has read this disclosure, it is, however, obvious that other examples according to the present teachings, which deviate from the specific details disclosed in this document, are protected by the attached claims. Moreover, descriptions of devices and methods known from the prior art may have been omitted for reasons of clarity. Such methods and equipment obviously lie within the scope of protection of the present teachings.

Figure 1:
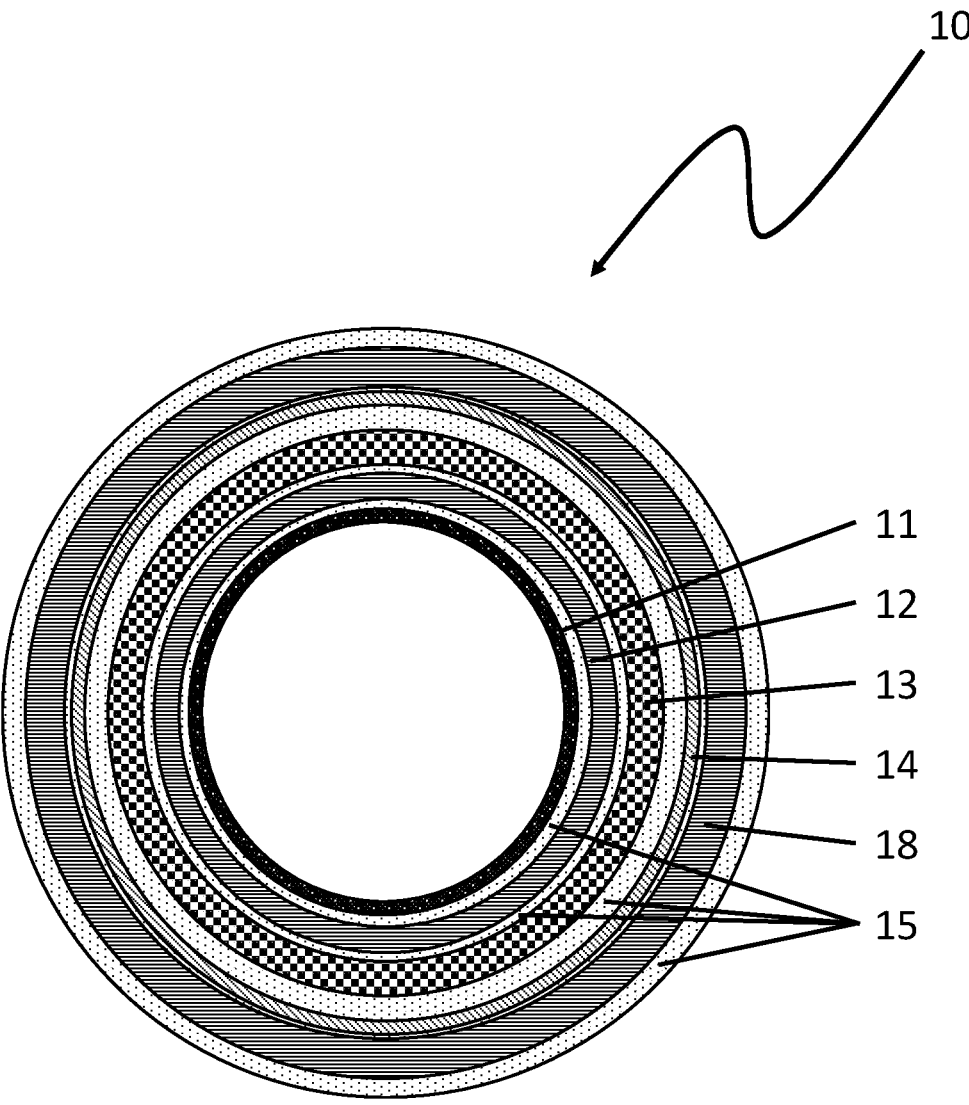
FIG. 1 shows a sectional drawing through an embodiment of the combined coil assembly according to the present invention comprising only a single layer of shim coils.

FIG. 1 schematically depicts an embodiment of the combined gradient coil and shim coil assembly 10 for use in MR-devices. The assembly 10 comprises a cylindric carrier tube 11 usually made of glass fiber material, a gradient coil system 12 arranged concentrically onto the carrier tube 11, a cooling tube assembly 13 positioned around the gradient coils 12, and an active shim coil system 14.

According to the invention, this combined assembly 10 is characterized in that the active shim coil system 14 is constructed on a flexible printed circuit board 22 (="PCB"), and the assembly further comprises a sealing compound 15 with a fluid reaction resin augmented with a heat conductive filler enclosing the components of the assembly 10 to form a cylindrical tube and filling the cavities of the gradient 12 and the shim coil 14 systems and between the coils 12; 14 and the carrier tube 11.

In most advantageous embodiments, the flexible printed circuit board 22 on which the active shim coil system 14 is constructed has the shape of a foil or a film, which is wound around the cooling tube assembly 13. The shim coil system 14 can be manufactured using a micromechanical process or a photolithographic process. Further, in embodiments of the invention not shown in the drawings, electronic components can be integrated on the PCB 22, in particular discrete components such as resistors or semiconductors for switching or measuring tasks.

The cooling tube assembly 13 can be made of a plurality of copper tubes assembled in a cage-like manner or using a single meander structure made from either welded or soldered tubes or a single 3D print structure.

Further, in the embodiment shown in FIG. 1, shielding or screening coils 18, which are preferably manufactured in a similar way as the gradient coil system 12, are applied to the outer circumference of the active shim coil system 14 before the vacuum casting step. Another embodiment of the invention comprising screening coils 18 around the shim coil system 14 is shown in the schematic sectional drawing of FIG. 4.

Figure 2A:
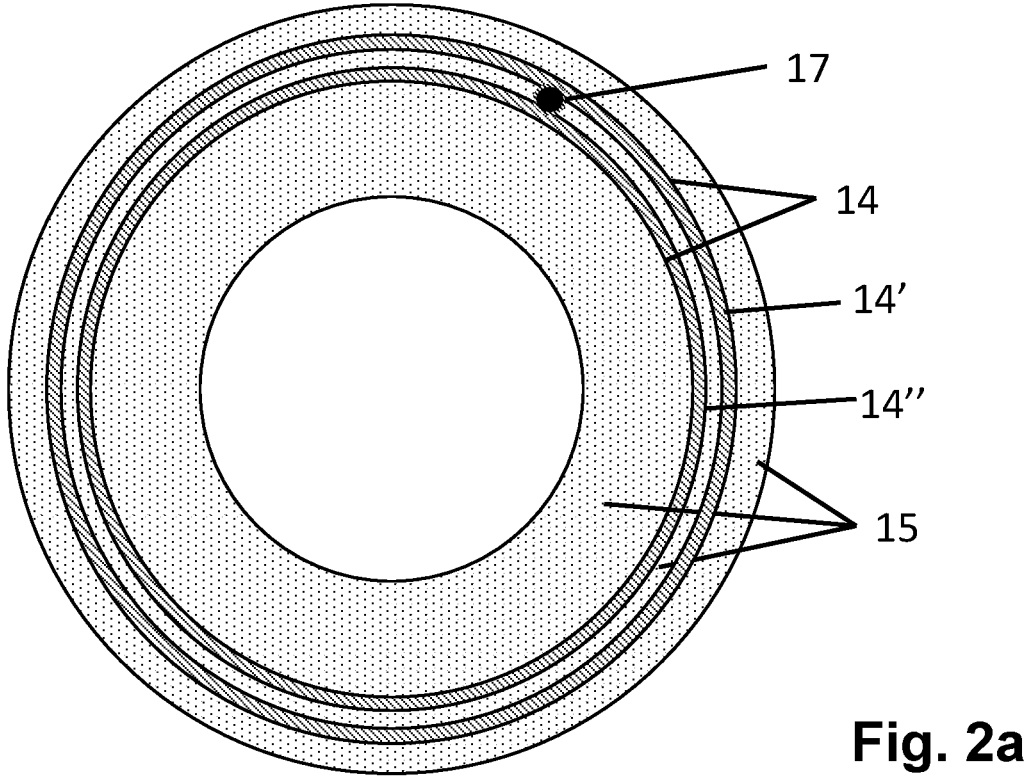
FIG. 2a shows a sectional drawing of the shim coil part of an embodiment of the invention comprising two layers of shim coils on flexible PCB being separated by a thread.

Referring to FIG. 2a, the shim coil system 14 can comprise a plurality of layers of flexible PCB wound concentrically around the axis of the cylindric carrier tube 11. To keep it simple, only the sealing compound 15 is shown in FIG. 2a, whereas other parts such as gradient and screen coils or cooling system are omitted. The embodiment shown in FIG. 2a has just two flexible PCB layers, each of which having a shim coil layer on either side of the PCB, i.e., a first shim coil layer 14' and a second shim coil layer 14". The adjacent layers 14'; 14" are separated by a spacer element 17, in particular a flexible filament or flexible profile of a desired thickness, preferably an electrically non-conducting thread.

Figure 2B:
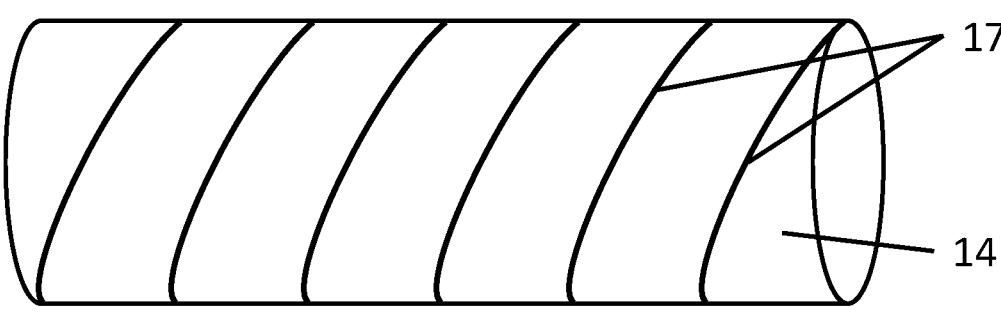
FIG. 2b shows a schematic spatial side view of a cylindrically wound shim coil assembly according to the inventing on which a separating thread or filament is helically wound.

FIG. 2b shows in a schematic spatial side view a cylindrically wound shim coil assembly 14 according to the inventing on which a spacer element 17 in form of a separating thread or filament is wound around the cylinder in a helical manner.

Figures 3, 4, 5A, 5B, 6, 7:
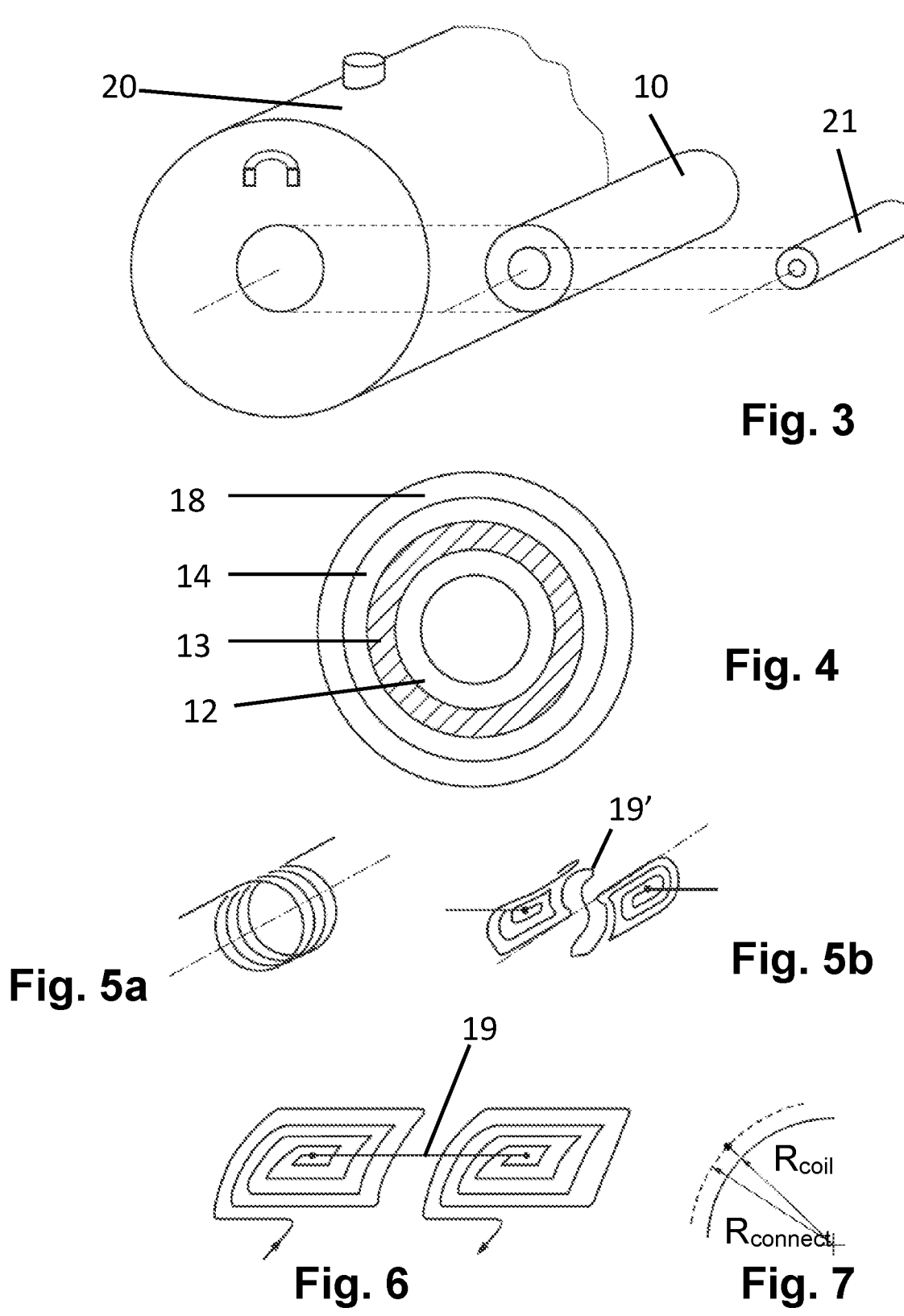
FIG. 3 shows in an exploded schematic view an embodiment of the combined coil assembly according to the present invention ready for being introduced into an MR magnet as well as an MR probe to be inserted afterwards for MR measurements.
FIG. 4 shows a schematic sectional drawing of a part of an embodiment of the invention comprising screening coils around the shim coil system.
FIG. 5a shows a schematic perspective view of a solenoid coil used in embodiments of the active shim coil system according to the invention.
FIG. 5b shows a schematic perspective view of a pair of saddle coils with a coil interconnection used in other embodiments of the active shim coil system according to the invention.
FIG. 6 shows a schematic perspective view of another pair of meandering saddle coils with a coil interconnection used in further embodiments of the active shim coil system according to the invention.
FIG. 7 shows a schematic partial sectional drawing of a shim coil illustrating the shim coil radius $R_{coil}$ in relation to the radius $R_{connect}$ of a coil interconnection.

The exploded schematic view of FIG. 3 depicts an embodiment of the combined coil assembly 10 according to the present invention before being introduced into an MR magnet 20 and an MR probe 21 to be inserted afterwards into the inner cavity of the combined coil assembly 10 for performing MR measurements.

FIGS. 5a and 5b show two typical coil types which are conveniently used for coil patterns in gradients and shims, namely solenoid coils and saddle coil pairs, first contributing predominantly to the axial field and second contributing predominantly to the transverse field where axial refers to the cylinder axis, usually the z-axis of the coordinate system.

The schematic perspective view of FIG. 5a shows a solenoid coil used in embodiments of the active shim coil system according to the invention.

In FIG. 5b a perspective view of a pair of saddle coils with a coil interconnection 19' is shown. This may be used in other embodiments of the invention.

FIG. 6 shows a perspective view of another pair of meandering saddle coils with a coil interconnection 19 used in further embodiments of the invention. This exemplary coil pattern comprises two side by side coils which are connected in series. To address the start of the winding at the center of each coil, a connecting trace 19 usually interferes with the coil turns if located on the same layer. Thus the coil interconnection 19; 19' can be realized by selecting a two-sided layout on a carrier.

FIG. 7, in a schematic partial sectional drawing of a shim coil, illustrates the shim coil radius $R_{coil}$ in relation to the radius $R_{connect}$ of a coil interconnection. It shows the solution to avoid interference by putting the interconnections on a different radius, i.e., on a different layer to avoid short circuits.

Figures 8A, 8B, 9:
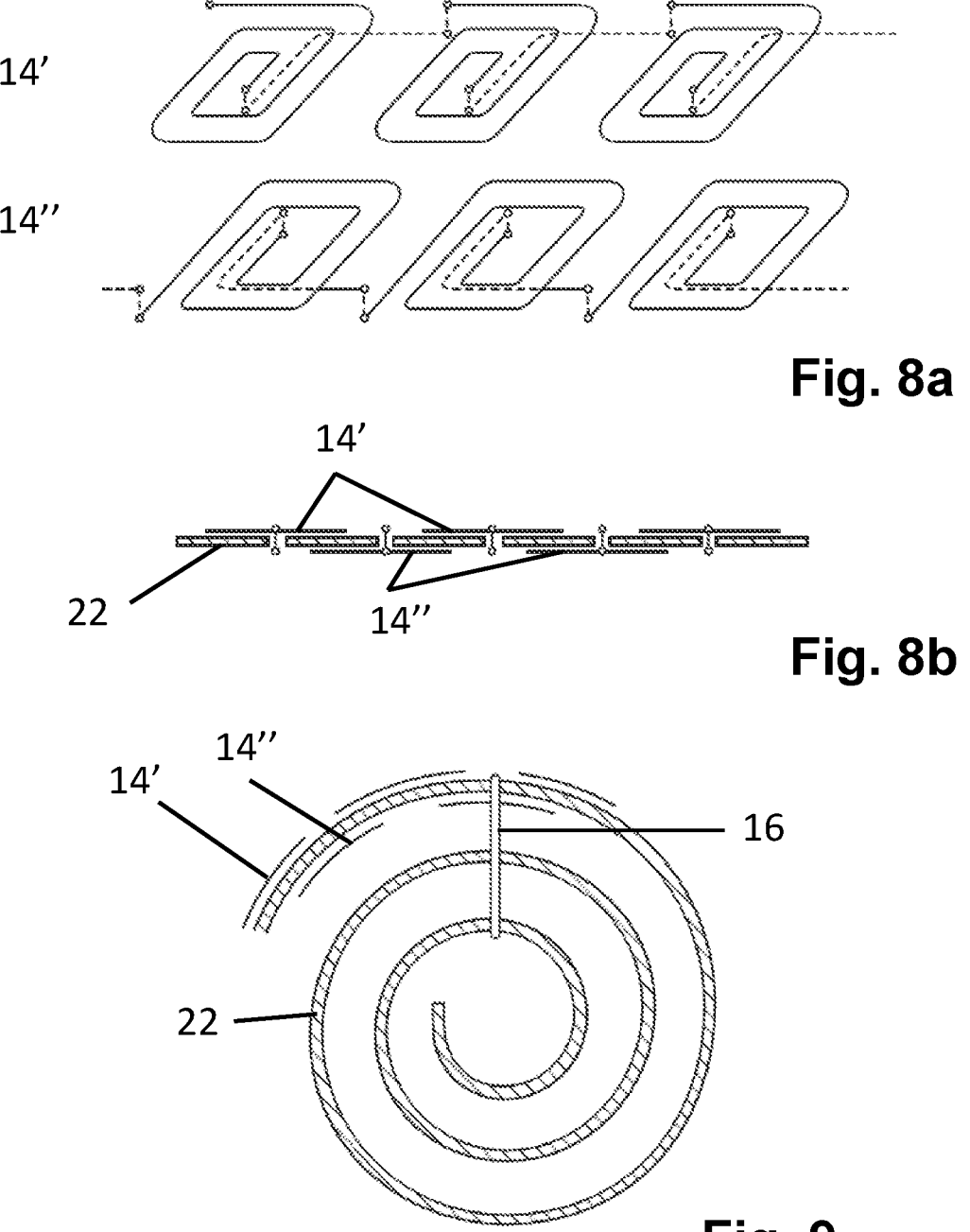
FIG. 8a shows a schematic perspective view of an embodiment of the active shim coil system according to the invention comprising two shim coil layers arranged in parallel on either side of a flexible printed circuit board (not shown in this figure), each shim coil layer having three pairs of meandering saddle coils with coil interconnections between neighboring coils.
FIG. 8b shows a schematic sectional drawing of the two shim coil layers of FIG. 8a on either side of the flexible printed circuit board.
FIG. 9 shows a schematic sectional drawing of a two-layered embodiment of the active shim coil system according to the invention wound in helical shape and comprising an alignment pin.

Connections from top layer to bottom layer (so-called "vias") allow routing these traces in the unused areas between the coils located on the opposite layer of the PCB, as shown in FIGS. 8a and 8b. With such an optimized layout it is possible to place four circuit layers (two coil layers, two connection layers) on a single double-sided foil. The single working step of applying this foil replaces about four work steps of conventional assembling technique, where the coil layers are attached to the cylindrical support structure followed by manually soldering and routing the interconnect wires.

FIG. 8a shows a schematic spatial view of an embodiment of the active shim coil system according to the invention comprising two shim coil layers 14'; 14" arranged in parallel on either side of a flexible printed circuit board (which is not shown in this figure). Each shim coil layer 14'; 14" has three pairs of meandering saddle coils with coil interconnections between neighboring coils.

This situation is depicted in FIG. 8b in a schematic sectional drawing of the two shim coil layers 14'; 14" of FIG. 8a on either side of the flexible PCB 22, with neighboring shim coil layers 14'; 14" each having coil interconnections.

FIG. 9 shows a schematic sectional drawing of a two-layered embodiment of the active shim coil system 14 according to the invention having a first shim coil layer 14' and a second shim coil layer 14" wound in helical shape and comprising a positioning/alignment pin 16. This is a possible realization of a flexible shim coil that comprises multiple layers, but is fabricated as a single piece, again combining multiple work steps. One or more locator pins may serve to align the layers and eliminate relative positioning errors. There may also be reference holes, which are, however, not shown in the present drawings for reasons of simplicity. These pins and holes are used for precise mounting in one of the concentrically lower components of the array so that the shim coils 14 are correctly positioned in the end. In particular, the lower components can be hooked into a first winding with a second set of holes.

While only certain features of the invention have been illustrated and described herein, many modifications and changes will occur to those skilled in the art. It is, therefore, to be understood that the appended claims are intended to cover all such modifications and changes as fall within the true spirit of the invention.

LIST OF REFERENCE NUMERALS 10 combined gradient coil and shim coil assembly
11 cylindric carrier tube
12 gradient coil system
13 cooling tube assembly
14 active shim coil system
14' first shim coil layer
14" second shim coil layer
15 sealing compound
16 positioning/alignment pins
17 spacer element, in particular separating thread
18 shielding or screening coils
19; 19' coil interconnection
20 MR magnet
21 MR probe
22 flexible printed circuit board

The invention claimed is:

1. A combined gradient coil and shim coil assembly for use in magnetic resonance (MR) devices, comprising:
a cylindric carrier tube,
a gradient coil system arranged concentrically onto the carrier tube,
a cooling tube assembly positioned around the gradient coil system,
an active shim coil system constructed on a flexible printed circuit board and comprising a plurality of layers of said flexible printed circuit board, the layers being wound concentrically around an axis of the cylindric carrier tube, each layer of flexible printed circuit board being separated from an adjacent layer by a spacer element, wherein the spacer element is wound in a helical manner around each layer of the flexible printed circuit board so as to separate shim coils of the shim coil assembly from each other and create a helical gap between the layers, and
a sealing compound with a fluid reaction resin augmented with a heat conductive filler enclosing the components of the combined gradient coil and shim coil assembly to form a cylindrical tube, the sealing compound spreading and filling the helical gap and filling cavities of the gradient and the shim coil systems and between coils of the gradient and the shim coil systems and the carrier tube.

2. The assembly according to claim 1, wherein the flexible printed circuit board on which the active shim coil system is constructed has the shape of a foil or a film, which is wound around the cooling tube assembly.

3. The assembly according to claim 1, wherein the flexible printed circuit board comprises positioning pins and/or reference holes which are used for precise mounting in a concentrically lower part of the combined gradient coil and shim coil assembly.

4. The assembly according to claim 1, wherein the flexible printed circuit board is manufactured using a micromechanical process or a photolithographic process.

5. The assembly according to claim 1, wherein the spacer element comprises an electrically non-conducting thread.

6. The assembly according to claim 1, wherein the spacer element is made of a polyimide.

7. The assembly according to claim 1, wherein electronic components are integrated on the flexible printed circuit board.

8. The assembly according to claim 7, wherein the electronic components comprise resistors and/or semiconductors for switching or measuring tasks.

9. The assembly according to claim 1, wherein coils of the combined gradient coil and shim coil assembly are arranged on either side of a two-sided carrier.

10. The assembly according to claim 1, wherein the cooling tube assembly comprises a plurality of copper tubes assembled in a cage-like manner or a single meander structure made from either welded or soldered tubes or a single 3D print structure.

11. A method of manufacturing an assembly according to claim 1, comprising:
providing a cylindric carrier tube;
applying the gradient coil system concentrically to the cylindric carrier tube;
applying the cooling tube assembly around the gradient coil system;
constructing the active shim coil system on flexible printed circuit board as a ready finished component that is wound and positioned on an outer surface of the cooling tube assembly;
potting or vacuum casting a concentric array defined by the carrier tube, the gradient coil system, the cooling tube assembly and the active shim coil system as a whole with the sealing compound, thus filling the cavities of the gradient and the shim coil systems and between the coils of the gradient and the shim coil systems and the carrier tube.

12. A method according to claim 11, further comprising applying the spacer element in the form of a separating thread wound helically between the at least two layers of shim coils.

13. A method according to claim 12, wherein shielding or screening coils are applied to an outer circumference of the active shim coil system before the vacuum casting step.

14. A method according to claim 11, further comprising using positioning pins and/or reference holes on the flexible printed circuit board for precise mounting in one of the concentrically lower components of the array so that the shim coils of the active shim coil system are correctly positioned, and the lower components are hooked into a first winding with a second set of holes.

* * * * *